United States Patent

Hirao et al.

[11] Patent Number: 6,127,211
[45] Date of Patent: Oct. 3, 2000

[54] METHOD OF MANUFACTURING TRANSISTOR

[75] Inventors: Takashi Hirao, Moriguchi; Akihisa Yoshida; Toru Fukumoto, both of Kyoto; Kazuyasu Adachi, Hirakata, all of Japan

[73] Assignee: Matsushita Electric Industrial Co., Ltd., Japan

[21] Appl. No.: 09/162,450

[22] Filed: Sep. 29, 1998

[30] Foreign Application Priority Data

Oct. 2, 1997 [JP] Japan .................................. 9-269565

[51] Int. Cl.⁷ .................................................. H01L 21/84
[52] U.S. Cl. .......................... 438/158; 438/151; 438/161; 438/162; 438/163
[58] Field of Search ................... 438/149, 151, 438/158, 161, 162, 163

[56] References Cited

U.S. PATENT DOCUMENTS 4,375,999  3/1983  Nawata et al. ........................ 148/187
4,716,127  12/1987  Shukuri et al. ........................ 437/27

FOREIGN PATENT DOCUMENTS 8-88365  4/1996  Japan .
9-218427  8/1997  Japan .

OTHER PUBLICATIONS

"Conduction Mechanism of Leakage Current Observed in Metal–Oxide–Semiconductor Transistors and Poly–Si Thin–Film Transistors"; M. Yazaki et al.; Seiko Epson Corp.; Oct. 4, 1991; pp. 206–209; Tokyo, Japan.

Primary Examiner—Long Pham
Attorney, Agent, or Firm—Parkhurst & Wendel, L.L.P.

[57] ABSTRACT

In a method of manufacturing a semiconductor device having an LDD structure, source gases for generating plural types of impurity ions exhibiting different molecular weights and different projected ranges in a target during impurity implantation are supplied to a plasma space, ionized, accelerated with a voltage, and implanted in a semiconductor region on the target substrate. In the case of manufacturing a top-gate transistor, a gate electrode on the semiconductor region has a sufficient thickness to serve as a mask. In the case of manufacturing a bottom-gate transistor, a mask and a resistor are used. An implantation angle is set to an optimum value as desired. Thereafter, the impurity is activated as desired. Thus, the semiconductor device having the LDD structure is manufactured by a single step of impurity implantation.

39 Claims, 11 Drawing Sheets

METHOD OF MANUFACTURING TRANSISTOR

BACKGROUND OF THE INVENTION

The present invention relates to a method of manufacturing a transistor represented by a thin-film transistor (TFT) formed as a switching element on a glass substrate for use in a liquid crystal display or the like and, more particularly, to a transistor for a liquid crystal display.

A liquid crystal display has been used widely and suitably for image display in a notebook personal computer, a mobile terminal, or the like because of a lower profile and lower power consumption easily achieved therein. In a liquid-crystal display as mentioned above, each pixel is driven by a thin-film transistor (switching).

For the achievement of improved brightness based on an increased aperture ratio and miniaturized pixels (reduced in size and increased in precision), attempts have been made in recent years to reduce the size of the thin-film transistor. However, mere miniaturization (scaling down and necessary adjustments) of a conventional structure may cause adverse effects including large off current, a short-channel effect and a hot-carrier effect.

To prevent the adverse effects, an LDD (Lightly Doped Drain) structure has been used in the TFT as well as in an LSI.

A description will be given to a conventional method of manufacturing a TFT with an LDD structure with reference to FIGS. 1, which are cross-sectional views illustrating the manufacturing process (impurity implantation and the resulting impurity distribution in a semiconductor).

First, a semiconductor layer 2 with a thickness of 10 to 100 nm is formed selectively on a predetermined portion of a glass substrate 1 in accordance with an arrangement pattern for a specific application. There has been a recent approach to using polysilicon (poly-Si: polycrystalline silicon) in the semiconductor layer as a replacement for amorphous silicon (a-Si) that has been used conventionally. According to the approach, a poly-Si layer is formed from an a-Si layer which has been formed on a glass substrate, sequentially subjected to exposure to an excimer laser, and recrystallization (annealing).

Thereafter, a gate insulating layer 3 composed of, e.g., $SiO_2$ is formed to a thickness of 50 to 100 nm on the glass substrate 1 formed with the semiconductor layer 2 in accordance with the same pattern, followed by a gate electrode 4 further formed on the gate insulating layer 3. At this stage, first impurity ions 5 (serving as donors or acceptors) are implanted by using the gate electrode 4 as a mask.

Specifically, P (phosphorus) ions are implanted with an acceleration voltage of 50 to 80 kV by using 5 to 20% $PH_3$ diluted with hydrogen (containing 5 to 20% $PH_3$ in volume) as a source gas to form low-concentration $n^-$ regions 7 in each of which P is at a concentration of $10^{15}$ to $10^{18}$ cm$^{-3}$. The process is illustrated in FIG. 1(a) ($PH_3^+$ is shown as the ions 5 in the drawing).

Although the upper portion of the gate electrode 4 is also doped with phosphorus for obvious reasons, the drawing thereof is omitted here.

Next, a patterned $SiO_2$ insulating film 6 is formed around the side faces of the gate electrode 4. The patterned insulating film may be formed from a $SiO_2$ film formed over the entire surface of the substrate 1 and subjected to dry etching or, alternatively, formed through the anodic oxidation of the side faces of the gate electrode 4.

At this state, the second impurity ions 5 are implanted into the semiconductor layer 2.

Specifically, P (phosphorus) ions are implanted with an acceleration voltage of 50 to 80 kV by using 5 to 20% $PH_3$ diluted with hydrogen as a source gas to form high-concentration $n^+$ regions 8 in each of which P is at a concentration of $10^{19}$ to $10^{21}$ cm$^{-3}$.

By the foregoing process, the semiconductor layer 2 is formed with the LDD regions 7 at a lower impurity concentration and with the source/drain regions 8 at an impurity concentration higher than that of the LDD regions as shown in FIG. 1(b) ($PH_3^+$ is also shown as the ions 5 in the drawing).

Finally, thermal treatment is performed at, e.g., 850 to 900° C. in a Si MOS transistor for use in an LSI or the like, thereby activating the impurity implanted in the two process steps described above.

In the case of manufacturing a thin-film transistor using a glass substrate or the like, however, it is difficult to perform thermal treatment at a high temperature so that thermal treatment, lamp heating, laser annealing, or the like is normally performed at a temperature on the order of 400 to 600° C.

The thermal treatment thus performed causes the implanted impurity to be bonded to Si, which activates and diffuses the implanted impurity. Consequently, the LDD regions 8 are expanded from the regions immediately under the side faces of the gate electrode 4 to regions closer to the center of the gate electrode.

However, the two steps of impurity implantation should be performed inevitably to form the aforesaid conventional thin-film transistor with the LDD structure, which leads to an increased number of process steps, higher cost, and a degraded production yield.

Although phosphorus is shown in FIGS. 1 by way of example, the number of process steps is preferably minimized in the case of implanting a deadly toxic impurity, such as As, instead.

SUMMARY OF THE INVENTION

The present invention has been achieved in view of the foregoing problems. It is therefore a primary object of the present invention to provide a method of manufacturing a transistor with an LDD structure which requires only one step of impurity implantation.

To attain the object, the manufacturing method in one aspect of the present invention comprises the steps of: forming a gate electrode on a semiconductor region; forming a plasma space by changing into a plasma a source gas containing an impurity element and generating plural types of impurity ions different in, e.g., molecular weight and different in projected range; and forming a source region or a drain region in the semiconductor region by accelerating the plural types of ions containing the impurity element which have been formed in the plasma space and simultaneously doping with the accelerated ions the semiconductor region masked at least with the gate electrode.

The method allows the formation of the LDD structure by a single step of ion doping through mere use of the source gas generating the plural types of ions different in projected range.

In another aspect of the present invention, the semiconductor region is doped with the ions containing the impurity element which have been formed in the plasma space, accelerated, and supplied obliquely to the surface of the semiconductor region.

In still another respect of the present invention, a patterned insulating film formed on a side face of the gate electrode are also used as a mask in doping the semiconductor region with the accelerated ions containing the impurity element which have been formed in the plasma space.

In yet another aspect of the present invention, the patterned insulating film and a protective film with or without a resist in addition thereto are also used as a mask in doping the semiconductor region with the accelerated ions containing the impurity element which have been formed in the plasma space.

Accordingly, low-concentration impurity regions (LDD regions) can be formed with ease and high controllability whether in a top-gate or bottom-gate transistor.

As the source gas containing the aforesaid impurity different in, e.g., molecular weight, the present invention uses gases containing different types of impurities such as P and As or a source gas containing the same impurity element but different in, e.g., molecular weight such that ions generated therefrom have different projected ranges and different distributions.

The present invention also uses a source gas generating ions different in electrovalency and different in projected range and distribution.

The present invention also uses means for producing a plasma which generates ions different in electrovalency and different in projected range and distribution.

The use of impurity elements different in conductivity type as different impurity elements allows not only the formation of the source/drain regions but also simultaneous impurity introduction for controlling the threshold voltage of the transistor.

EMBODIMENTS OF THE INVENTION

Figure 1A:
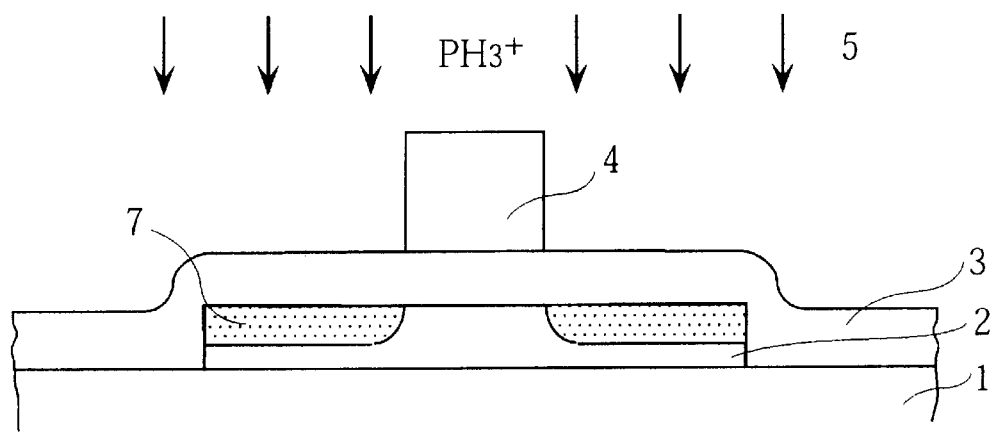
FIG. 1(a)–1(b) are cross-sectional views illustrating the process of manufacturing a thin-film transistor by prior-art technology.

A description will be given below to the individual embodiments of the present invention.

Embodiment 1

The first embodiment forms an LDD structure by a single step of impurity implantation, which has been formed conventionally by at least two steps of impurity implantation. In the step of impurity implantation, a plurality of (original) source gases containing impurity elements and having different molecular weights are changed into a plasma, which is immediately introduced into a semiconductor region (semiconductor layer). In general, doping characteristics including projected range influence the distribution of implanted ions and are determined by such attributes as molecular weight (atomic weight), kinetic energy, atomic diameter, mass ratio to a target atom, diffusion coefficient, and affinity (reactivity) to the target atom. For example, ionic penetration is more likely to occur with a smaller atomic weight and with higher kinetic energy. Since ions of different elements are used, the foregoing parameters differ from element to element and the distributions of implanted ions also differ from element to element. The process of ion implantation is performed by utilizing the different distributions of implanted ions due to different doping characteristics including different projected ranges. In the present embodiment, P (phosphorus) and As (arsenic) are introduced as n-type impurities at the same time to form LDD regions and source/drain regions simultaneously.

FIGS. 2 are cross-sectional views illustrating the process of manufacturing a thin-film transistor according to the first embodiment. A description will be given to the individual process steps with reference to FIGS. 2.

First, a semiconductor layer 2 is formed on a substrate 2 composed of a translucent material such as glass. Then, annealing or like treatment is performed by using an excimer laser to form a polysilicon layer with a thickness of about 50 nm.

Thereafter, a gate insulating layer 3 composed of, e.g., $SiO_2$ is formed to a thickness of 50 to 100 nm on the substrate 1 formed with the semiconductor layer 2.

A gate electrode 4 with a thickness of 100 to 200 nm is further formed on the gate insulating layer 3.

Figure 1B:
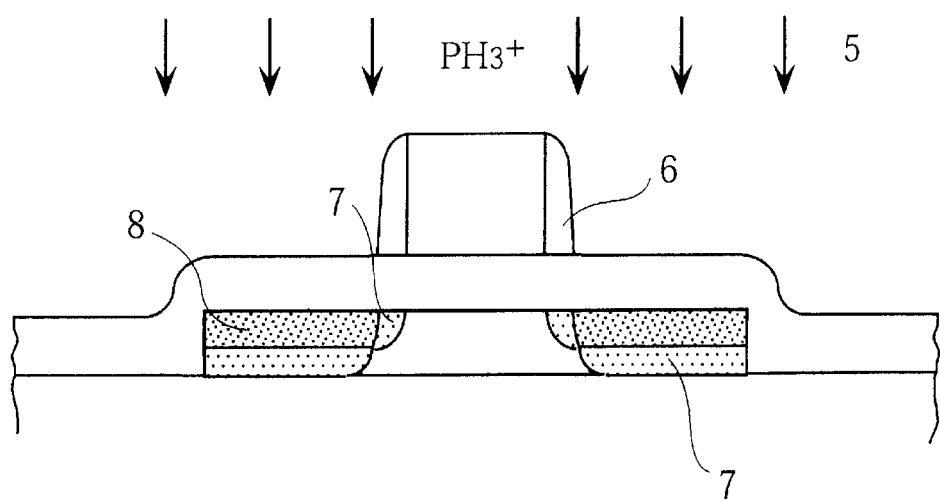

The resulting gate electrode has a width (gate length: L) on the order of 3 to 10 $\mu$m, which is all the same as in the conventional embodiment illustrated in FIGS. 1.

At this stage, impurity ions 5 are implanted by using the gate electrode 4 as a mask.

In the present embodiment, P and As are introduced simultaneously by ion doping. Specifically, 0.1 to 1% $PH_3$ diluted with hydrogen is used as a source gas containing P and supplied at a flow rate of 0.5 to 10 sccm (standard cubiccenti per minute), while 5 to 20% $AsH_3$ diluted with hydrogen is used as a source gas containing As and supplied at a flow rate of 50 to 200 sccm. Each of the source gases is supplied under a maximum pressure of $10^{-3}$ Torr, preferably $10^{-4}$ Torr. An acceleration voltage ranges from 50 to 100 kV. The doping process is shown in FIG. 2(a).

Figure 2A:
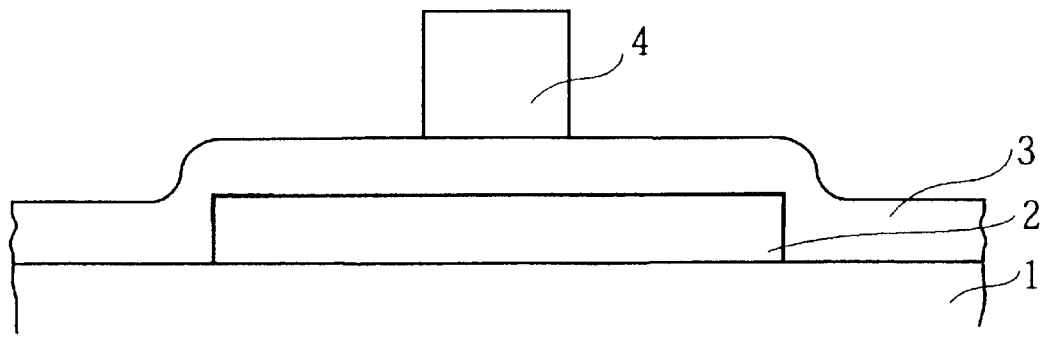
FIGS. 2(a)–2(c) are cross-sectional views illustrating the process of manufacturing a thin-film transistor according to a first embodiment of the present invention.

In the step shown in FIG. 2(a), the amount of P implanted to form the LDD regions is adjusted to be smaller than the amount of As implanted to form the source/drain regions.

The present embodiment has selected the hydrogen compounds as a As compound and a P compound in consideration of: increased kinetic energy gained by As and P used for doping due to the small atomic weight of hydrogen; lesser damage caused in the crystal structure of a target semiconductor; ease of handling due to the generally lower boiling point of a hydrogen compound, which is gaseous at room temperature; the annealing effect of hydrogen; the escaping of unnecessary hydrogen during thermal treatment; and the compensation of a dangling void or an impurity defect in the crystal.

The description will be given next to an apparatus for performing ion doping.

Figure 3:
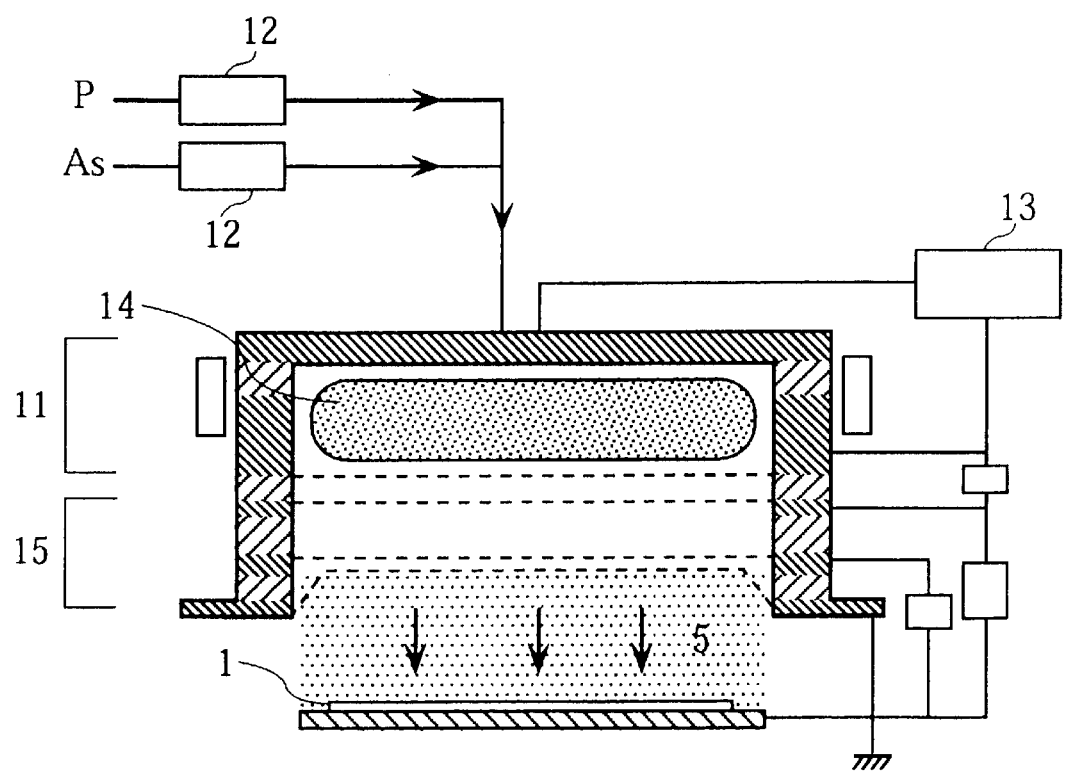
FIG. 3 is a schematic view showing the structure of an ion doping apparatus.

FIG. 3 schematically shows the structure of the ion doping apparatus comprising a chamber 11 as an ion source.

A gas mixture of hydrogen-diluted $PH_3$ and $AsH_3$ are supplied as source gases into the chamber 11 at a flow rate controlled by a mass flow controller 12. The source gases are mixed preliminarily with a view to preventing uneven supply of P and As to a large number of small semiconductor devices arranged on the large semiconductor substrate.

The source gases have been diluted with hydrogen gas with a view to preventing the deposition of fine powder of As and P on the wall of the discharge chamber of the apparatus, which might cause a leakage of current. The source gases are supplied from above the chamber suitably for the refreshment of the source gases.

The source gases are discharged/excited by an RF power source 13 to form a plasma space 14. The present embodiment has used the RF power source to change the source gases into a plasma because an even distribution of ions is achieved even when the plasma space 14 has a large capacity.

The charged ions present in the plasma space 14 are then extracted/accelerated by an ion extraction/acceleration electrode 15.

Subsequently, the ions are supplied in a beam with a diameter of about 70 cm to each of the semiconductor devices formed on a comparatively large base for a liquid-crystal display to be implanted therein.

The ions supplied to the substrate include ions containing As, ions containing P, and hydrogen ions.

Specifically, a majority of ions containing As are $AsH_x^+$ (x=0, 1, 2, and 3), a majority of ions containing P are $PH_x^+$ (x=0, 1, 2, and 3), and a majority of hydrogen ions are $H_2^+$ and $H_3^+$, while $H^+$ ions exist in small quantity.

A description will be given to the kinetic energy of each ion.

If it is assumed that E represents an electric field, m represents the molecular weight of an ion, q represents the electrovalency of the ion, F represents force received by the ion from the electric field, α represents an acceleration rate for the ion, l represents a distance traveled by the ion during acceleration, v represents the final speed of the ion, and K represents the final kinetic energy of the ion, the following equations are satisfied:

$$\alpha \cdot t^2 = 2 \cdot l$$

$$v = \alpha \cdot t$$

$$F = m \cdot \alpha = q \cdot E = q \cdot V/l$$

$$K = m \cdot v^2/2 = F \cdot l = q \cdot V.$$

From the foregoing equations, K=Fl is derived to indicate that each ion has the same kinetic energy irrelevant of the constituent element and molecular weight thereof provided that it has the same electrovalency of +1. For reference purposes, l ranges from 1 to 30 cm in the present embodiment.

In the case of implanting such molecular ions, they are decomposed to individual constituent atoms in collision with the constituent atoms of a sample. Since the bond energy of each element (molecule) is negligible compared with the kinetic energy thereof, the kinetic energy of each ionic particle (ionized molecule) is decomposed to each element at the ratio of atomic weight of each element/molecular weight of ionic species during implantation, so that the element is implanted into the sample with the gained energy.

Accordingly, the distributions of As (atomic number 75) and P (atomic number 31) implanted in the form of $AsH_x^+$ and $PH_x^+$ are substantially the same as the distributions of As and P implanted in the form of $As^+$ and $P^+$.

Thus, the use of the ion doping apparatus shown in FIG. 3 allows impurity ions different in molecular weight to be easily accelerated and simultaneously supplied to the substrate 1 by merely introducing the source gases different in molecular weight into the chamber 11 forming the plasma space.

Figure 2B:
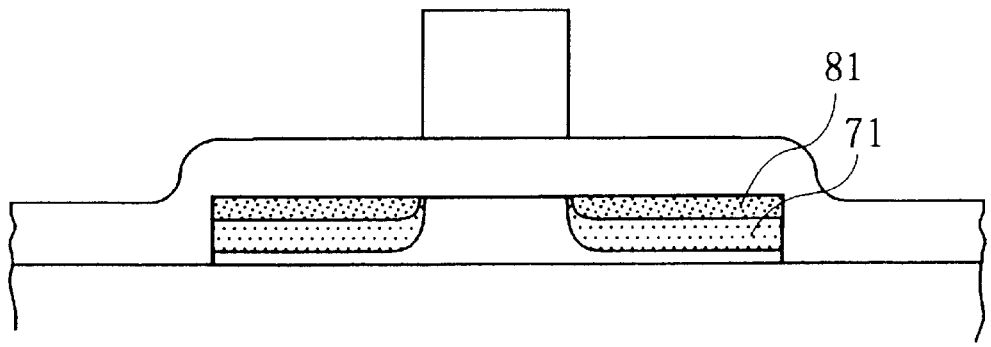

The foregoing ion doping process provides as impurity profile as shown in FIG. 2(b).

More specifically, since P has an atomic weight smaller than that of As, P is introduced into the semiconductor layer 2 deeper than As if ion doping is performed with the same acceleration voltage of 50 to 100 kV.

Moreover, since P is scattered to a greater degree in collision with a target element, P is also implanted in a region slightly interior to the region immediately under the mask.

As a result, first impurity regions 81 each containing P and As and second impurity regions 71 each containing only P are formed as shown in FIG. 2(b).

Although P and As have actually been implanted in the upper half portion of the gate electrode 4, the drawing thereof is omitted in the present and other embodiments, since the fact is obvious and has no direct relation to the essence of the invention.

Figure 4:
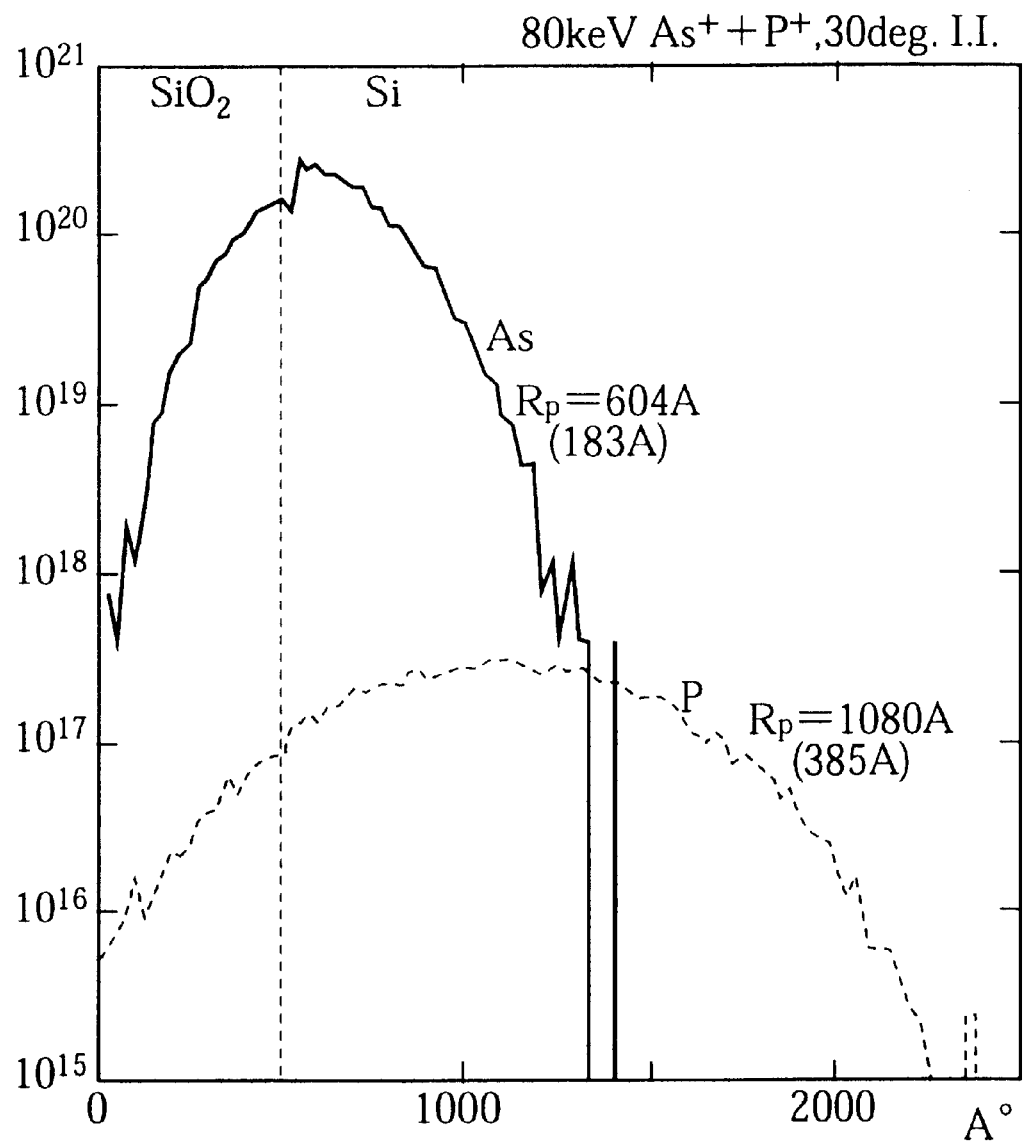
FIG. 4 shows the results of simulating the vertical concentration distributions of an ion impurity implanted into a semiconductor layer each plotted as a function of depth according to each of the embodiments of the present invention.

FIG. 4 shows the results of simulating the vertical distributions of P and As concentrations in the semiconductor layer 2 each plotted as a function of depth (it will be understood that there is no significant difference between the simulated distributions and actual distributions). In the drawing, the vertical axis represents the vertical distance away from the surface of the gate insulating layer 3 formed on the semiconductor layer 2 to a portion at depths of the semiconductor layer 2 and the horizontal axis represents the concentrations of P and As.

As will be understood from the drawing, since P and As have been introduced into the semiconductor layer 2 simultaneously with the same energy, P having a smaller molecular weight has reached a deeper portion of the semiconductor layer 2 than As.

After the implantation of P and As, a conductive film may be formed over the entire surface of the substrate, which is subjected to thermal treatment to form an electrode including the conductive film on the drain region.

Figure 2C:
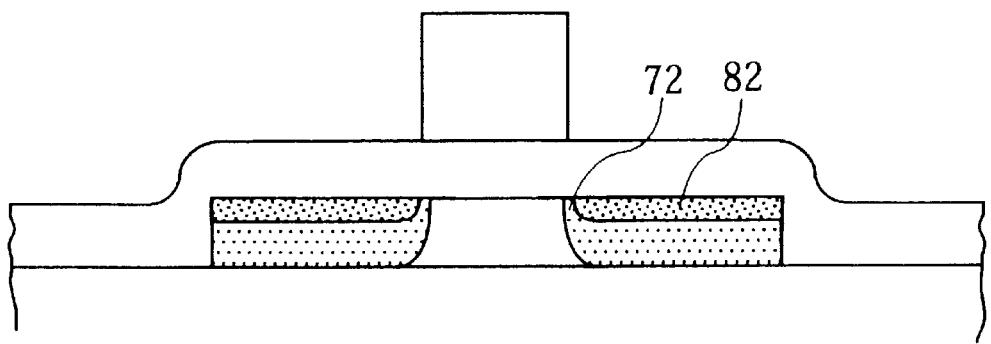

During the thermal treatment or the annealing by excimer laser, the impurities are activated and slightly diffused, resulting in a profile (distribution structure) as shown in FIG. 2(c).

As a result, there can be formed source/drain regions 82 composed of high-concentration $n^+$ layers and LDD regions 72 composed of low-concentration $n^-$ layers.

By thus using the different diffusion coefficients and impurity distributions of P and As, the present embodiment can form the LDD regions composed of the low-concentration n⁻ layers and the source/drain regions composed of the high-concentration n⁺ layers by a single step of impurity introduction in which P and As are implanted simultaneously into the semiconductor layer 2 to form the n-type impurity regions therein.

Moreover, the present embodiment accomplishes doping at a time without scanning the large substrate with a beam.

Furthermore, the existing apparatus can be used with substantially no modification since two source gases are mixed satisfactorily in advance in an elongated supply pipe before being supplied to the apparatus.

Embodiment 2

A description will be given next to another embodiment of the method of manufacturing a thin-film transistor according to the present invention.

The second embodiment is different from the first embodiment in that the impurities are introduced obliquely into the surface of the semiconductor layer. Accordingly, the acceleration voltage is set slightly higher to 70 to 150 kV than in the first embodiment. As for the structure, configuration, and dimensions of the substrate and semiconductor devices and the type and flow rate of gas, they are the same as in the first embodiment.

The present embodiment will be described in greater detail with reference to FIG. 5, which are cross-sectional views illustrating the manufacturing process.

Figure 5A:
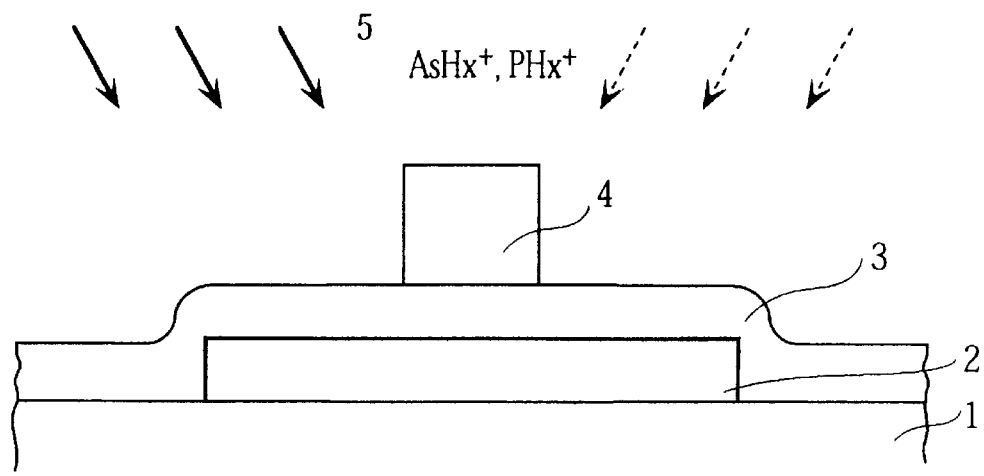
FIGS. 5(a)–5(c) are cross-sectional views illustrating the process of manufacturing a thin-film transistor according to a second embodiment of the present invention.

As indicated by the arrows in FIG. 5(a), the ions 5 are supplied obliquely to the surface of the substrate 1. The tilt angle is set at 30 degrees off the normal to the sample face.

It will be appreciated that, as occasion demands, an optimum value is selected for the tilt angle based on the thickness of a target sample and on the relation between the width and height of the gate electrode serving as a mask and a spacing between the gate electrodes of adjacent transistors, e.g., the ratio of the height to the spacing.

Since the mask pattern of the gate electrodes or the like casts shadows under a beam of ions, the substrate kept from contact with a power source and a gas source is rotated continuously or intermittently in the range of 0 to 90 degrees or 0 to 180 degrees.

Figure 5B:
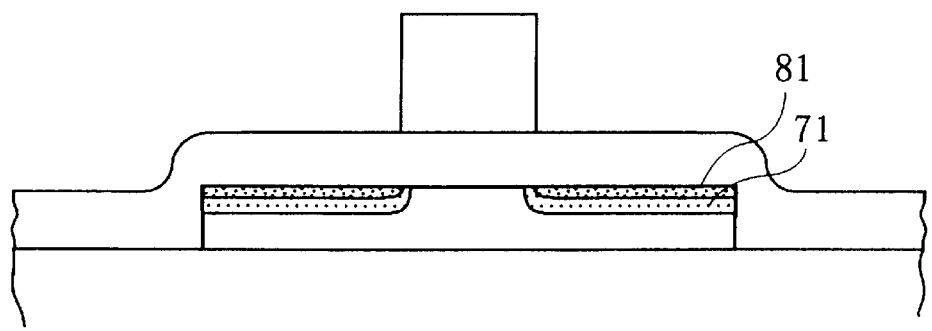

The ion doping process provides an impurity profile as shown in FIG. 5(b).

More specifically, since P has a molecular weight smaller than that of As, P is introduced into the semiconductor layer 2 deeper than As if ion doping is performed at the same acceleration voltage of 70 to 150 kV as stated previously. As a result, a first impurity region 81 containing P and As and a second impurity region 71 containing only P are formed as shown in FIG. 5(b).

Figure 5C:
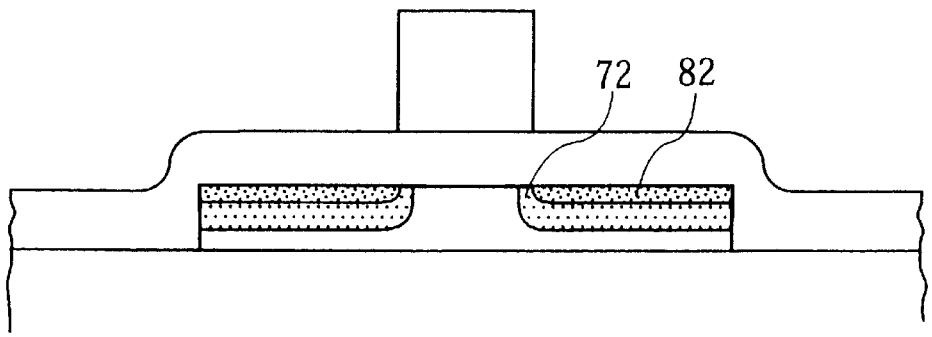

Thereafter, thermal treatment is performed to activate the impurities, similarly to the first embodiment, resulting in an impurity distribution as shown in FIG. 5(c), which is substantially the same as in the first embodiment.

Since the ions are obliquely supplied in the present embodiment, P atoms lighter in weight can be introduced extensively from the regions immediately under the side faces of the gate electrode to regions closer to the center of the gate electrode.

Therefore, the resulting LDD structure satisfactorily performs intrinsic functions without thermal treatment for positively diffusing the impurities, which is different from the first embodiment.

This is advantageous in the case where thermal treatment at 500° C. or higher is difficult due to the material of the substrate or the like.

Embodiment 3

A description will be given next to still another embodiment to the method of manufacturing a thin-film transistor according to the present invention.

The third embodiment is different from the first embodiment described above in that a patterned insulating film is formed around the side faces of the gate electrode prior to the introduction of the impurities into the semiconductor layer. As for the structure, configuration, and dimensions of the substrate and semiconductor devices and the type and flow rate of gas, they are the same as in the first embodiment.

The present embodiment will be described in greater detail with reference to FIGS. 6, which are cross-sectional views illustrating the manufacturing process, while attention is focused on the different portions.

Figure 6A:
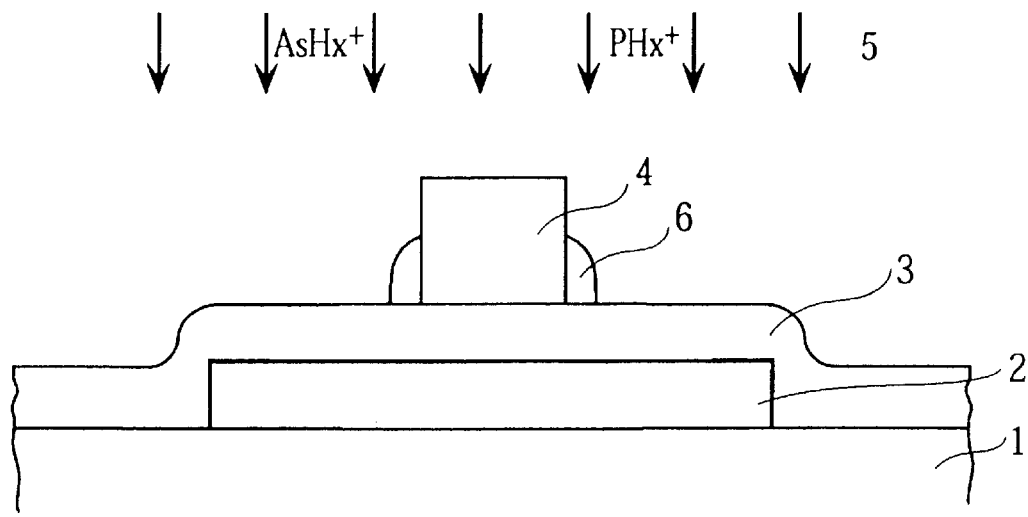
FIGS. 6(a)–6(c) are cross-sectional views illustrating the process of manufacturing a thin-film transistor according to a third embodiment of the present invention.

First, a patterned insulating film 6 is formed around the side faces of the gate electrode 4 by forming, e.g., a SiO₂ film over the entire surface of the structure and performing dry etching with respect thereto under such conditions as to keep the SiO₂ film slightly underetched. Subsequently, the impurity ions 5 are implanted by using the gate electrode 4 and the patterned insulating film 6 as a mask, as shown in FIG. 6(a).

Figure 6B:
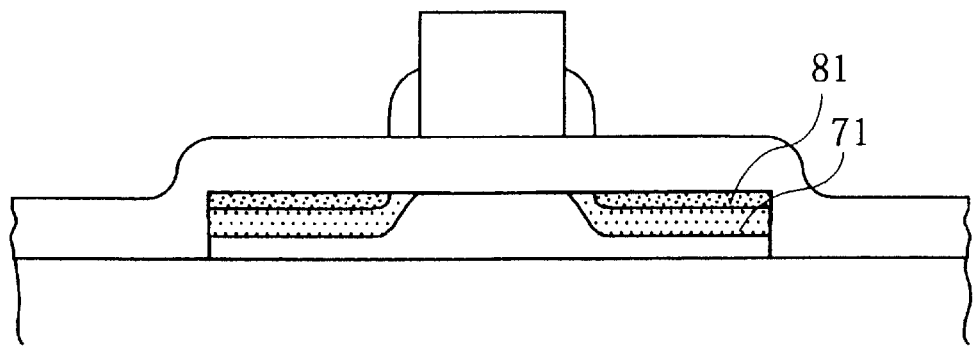

What results is an impurity distribution (profile) as shown in FIG. 6(b).

More specifically, the patterned insulating film 6 formed to surround the side faces of the gate electrode 4 serves as a mask and allows selective introduction of P into the semiconductor layer 2, while preventing As from being introduced into the semiconductor layer 2.

As a result, there are formed the first impurity regions 81 containing P and As and the second impurity regions 71 containing only P.

Thereafter, such a process as thermal treatment, lamp heating, and laser annealing is performed to activate the impurities, which slightly diffuses the impurities.

Consequently, P is diffused extensively from the regions immediately under the side faces of the gate electrode 4 to regions closer to the center of the gate electrode, resulting in the source/drain regions 82 composed of high-concentration n⁺ layers and the LDD regions 72 composed of low-concentration n⁻ layers.

Thus, since the present embodiment has formed the patterned insulating film 6 around the side faces of the gate electrode 4 such that it is used as a mask, the second impurity regions containing only P can be formed closer to the center of the gate electrode than the first impurity regions containing P and As at the stage prior to the thermal treatment illustrated in FIG. 5(c).

Hence, it may be concluded that the present embodiment, which allows the LDD regions to be formed with greater ease and higher controllability, is more preferred than the first embodiment in the manufacture of a thin-film transistor in which the need for high-temperature thermal treatment should be minimized because of the material of the substrate.

Figure 6C:
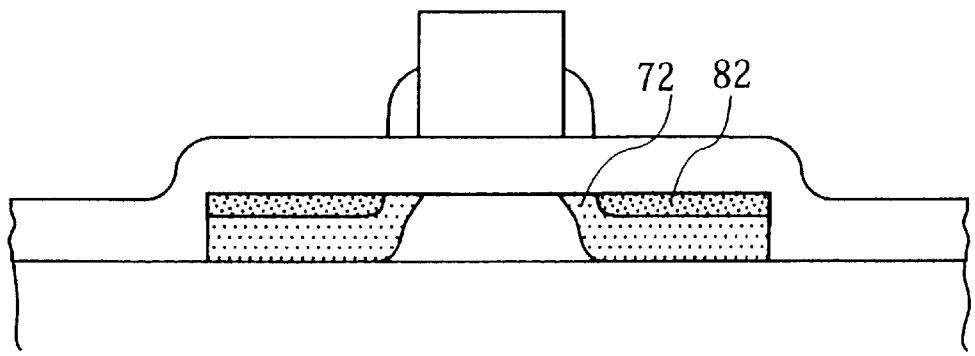

Although the uppermost portion of the patterned insulating film 6 is lower in level than the uppermost portion of the gate electrode 4 in the present embodiment, as shown in FIG. 6, this is for preventing the introduction of the impurities into the channel region under the gate electrode 4 and ensuring the introduction of P in the region under the patterned insulating film 6.

The uppermost portion of the patterned insulating film 6 may be substantially flush with the uppermost portion of the gate electrode depending on conditions. In that case, the conventional process of forming an insulating film can be used without any alterations.

Although the patterned insulating film 6 has been formed around the side faces of the gate electrode 4, it will be understood that the patterned insulating film 6 may be formed only on the two opposing side faces of the gate electrode 4.

Embodiment 4

A description will be given next to yet another embodiment of the method of manufacturing a thin-film transistor according to the present invention.

The fourth embodiment is a combination of the second and third embodiments described above.

Therefore, the present embodiment is different from the first embodiment in that the patterned insulating film is formed around the side faces of the gate electrode prior to the introduction of the impurities into the semiconductor layer and that the impurities are obliquely introduced into the semiconductor layer. As for the structure, configuration, and dimensions of the substrate and semiconductor devices, they are the same as in the first embodiment except that the patterned insulating film around the side faces of the gate electrode has the same configuration and dimensions as the gate electrode. The types and flow rates of the gases are also the same as in the previous three embodiments.

The acceleration voltage and the tilt angle for an ion beam are the same as in the second embodiment.

Figure 7A:
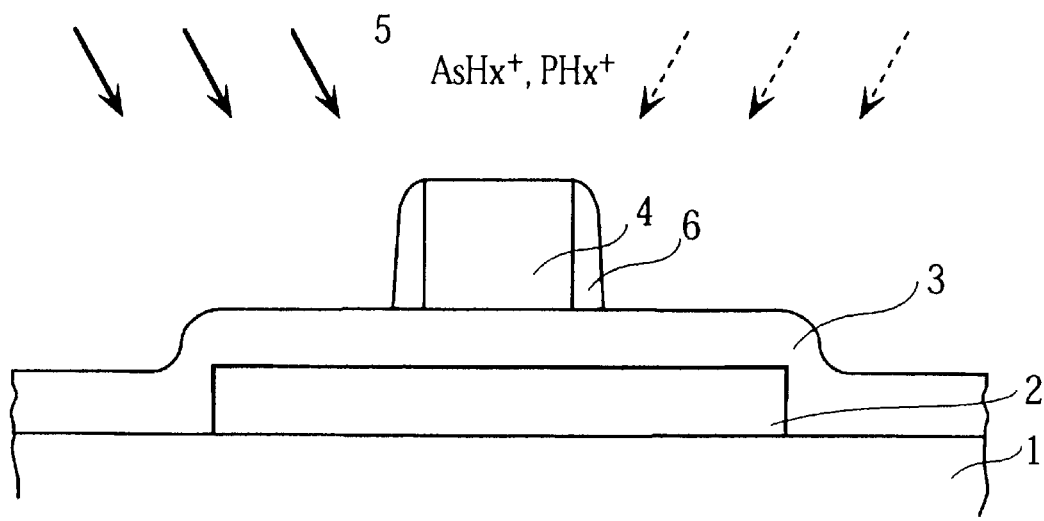
FIGS. 7(a)–7(c) are cross-sectional views illustrating the process of manufacturing a thin-film transistor according to a fourth embodiment of the present invention.

The present embodiment will be described in greater detail with reference to FIGS. 7, which are cross-sectional views illustrating the manufacturing process.

First, the patterned insulating film is formed around the side faces of the gate electrode 4 in the same manner as in the third embodiment. Subsequently, the impurity ions 5 are implanted by using the gate electrode 4 and the patterned insulating film 6 as a mask. The implantation process is illustrated in FIG. 6(a).

The present embodiment is also the same as the second embodiment in that the substrate is continuously rotated because the ion beam is supplied obliquely.

Figure 7B:
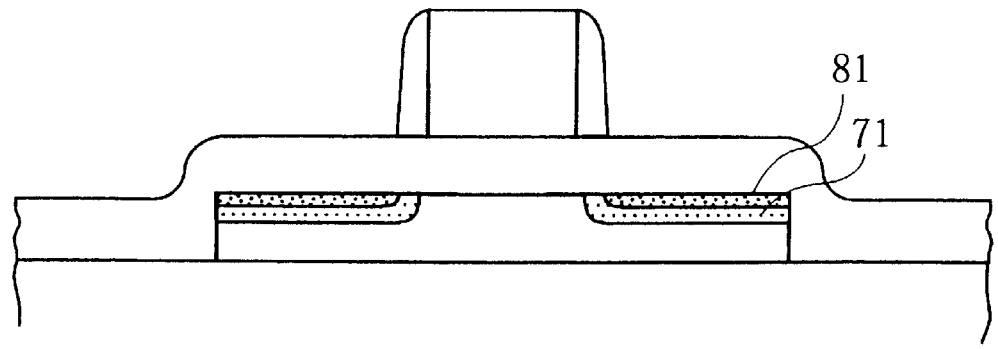
Figure 7C:
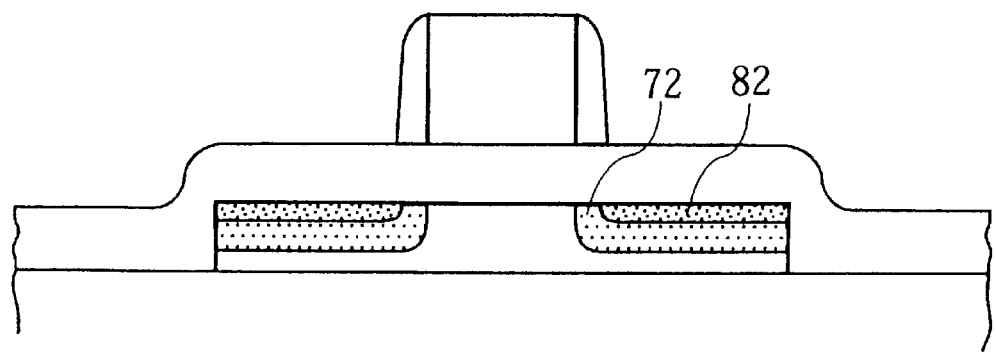

What results is an impurity profile as shown in FIG. 7(b).

Thus in the present embodiment, the effects described in the second and third embodiments are exerted more remarkably.

Embodiment 5

A description will be given next to still another embodiment of the method of manufacturing a thin-film transistor according to the present invention.

The fifth embodiment is greatly different from the foregoing first to fourth embodiments in that, in introducing n-type impurities such as P and As into the semiconductor layer by ion doping, B (boron) is also introduced simultaneously as a p-type impurity.

The present invention will be described in greater detail with reference to FIGS. 8, which are cross-sectional views illustrating the manufacturing process.

Figure 8A:
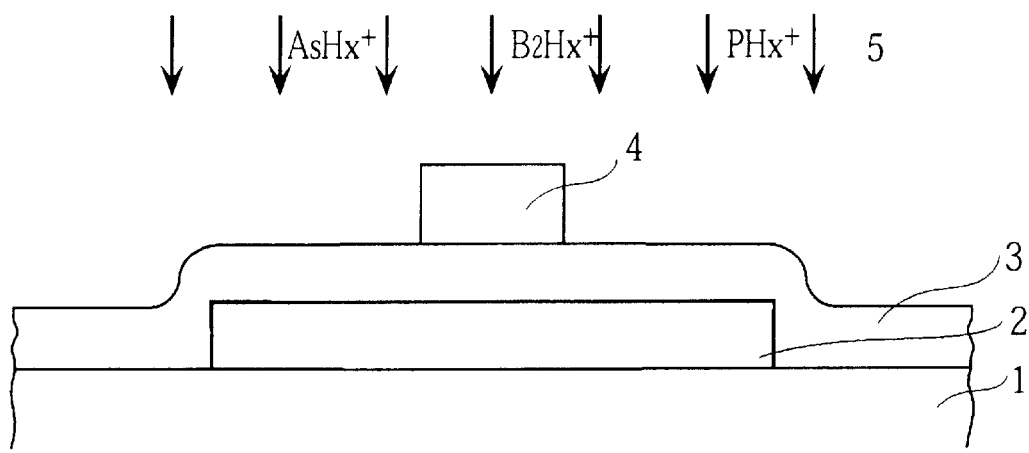
FIGS. 8(a)–8(c) are cross-sectional views illustrating the process of manufacturing a thin-film transistor according to a fifth embodiment of the present invention.
Figure 8B:
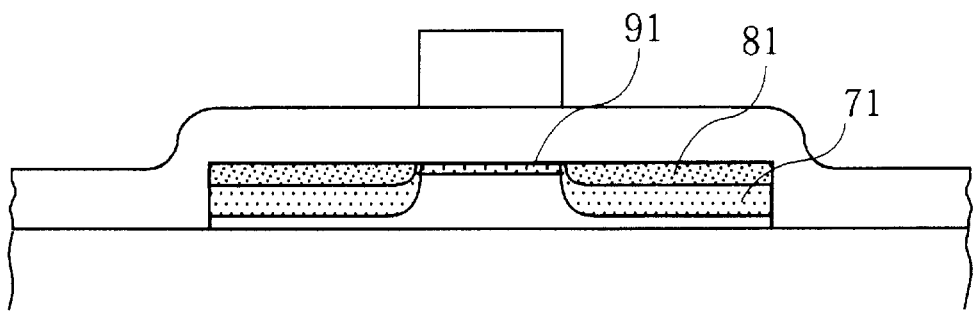
Figure 8C:
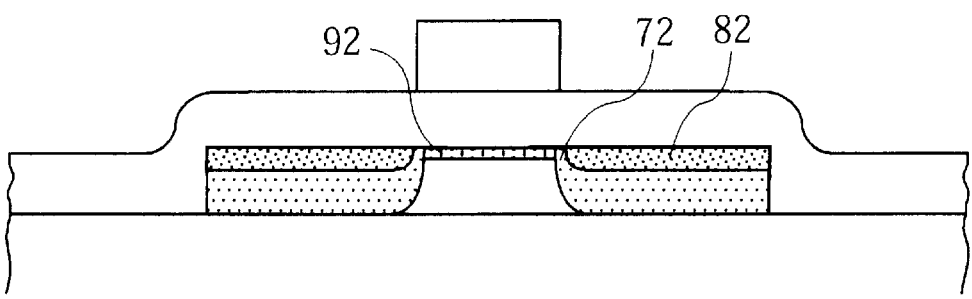

FIGS. 8 are cross-sectional views illustrating the process of manufacturing a thin-film transistor according to the present embodiment.

First, a semiconductor layer 2 is formed on a substrate 1 made of glass or the like, followed by a gate insulating layer 3 formed thereon. Then, a gate electrode 4 having a thickness on the order of 100 nm, which is slightly thinner than in each of the foregoing embodiments, is further formed on the gate insulating layer 3.

Subsequently, impurity introduction is performed by using the gate electrode 4 as a mask, as shown in FIG. 8(a).

The present embodiment introduces the additional p-type impurity of B simultaneously with the introduction of the n-type impurities of P and As.

As respective source gases containing P, As, and B, 0.1 to 1% $PH_3$ diluted with hydrogen, 5 to 20% $AsH_3$ diluted with hydrogen, and 0.1 to 1% $B_2H_6$ diluted with hydrogen are used and supplied at respective flow rates of 0.5 to 10 sccm, 50 to 200 sccm, and 0.5 to 10 sccm. Under such conditions, doping is performed with an acceleration voltage of 70 to 150 kV. The pressure or the like is adjusted to be the same as in the foregoing embodiments.

In the step shown in FIG. 8(a), the amount of P implanted to form the LDD regions is set smaller than the amount of As implanted to form the source/drain regions, similarly to each of the foregoing embodiments.

The foregoing ion doping process provides an impurity profile as shown in FIG. 8 (b).

The description of B will be given below, while the description of P and As will be omitted since they are the same as in each of the foregoing embodiments.

Since B has larger implant energy than P, B penetrates through the portions which will form the LDD regions 72 and the source/drain regions 82 (with the total thickness of 100 to 150 nm) later to reach the substrate. Hence, B is not present in the regions. However, since B supplied to the region underlying the gate electrode 4 (channel region) with a thickness of 100 nm is blocked by the gate electrode and prevented from reaching the substrate, a B-doped layer 91 can be formed in the channel region.

The impurities are slightly diffused by thermal treatment performed subsequently to activate the impurities. Consequently, P is more likely to diffuse into regions closer to the center of the gate electrode than into the regions immediately under the side faces of the gate electrode 4, resulting in the LDD regions 72 composed of the low-concentration $n^-$layers and the source/drain regions 82 composed of the high-concentration $n^+$layers.

Thus, the present embodiment not only introduces P and As simultaneously to form the LDD regions composed of the low-concentration $n^-$layers and the source/drain regions composed of the high-concentration $n^+$layers as in each of the foregoing embodiments but also selectively introduces the p-type impurity of B, which is a lighter element, into the channel region under the gate electrode 4. It is the existence of the B layer 92 that allows control of the threshold voltage of the thin-film transistor.

Although the present embodiment has been achieved in accordance with the first embodiment except that B is introduced in addition to P and As, it will be appreciated that the present embodiment may also be achieved in accordance with the second to fourth embodiments.

It will be appreciated that another gas such as $BF_3$ may be used as the gas containing B, instead of $B_2H_6$.

Embodiment 6

A description will be given next to yet another embodiment of the method of manufacturing a thin-film transistor according to the present invention.

The sixth embodiment is different from any of the foregoing embodiments in that a thin-film transistor having an LDD structure is formed by a single step of doping in which a single element of As, not the different impurity elements of P and As, is introduced.

The present embodiment will be described in greater detail with reference to FIGS. 9, which are cross-sectional views illustrating the manufacturing process.

First, a semiconductor layer 2 is formed on a substrate 1 made of glass or the like, similarly to the first embodiment. Then, a gate insulating layer 3 is formed on the semiconductor layer 2, which is followed by a gate electrode 4 formed thereon.

Figure 9A:
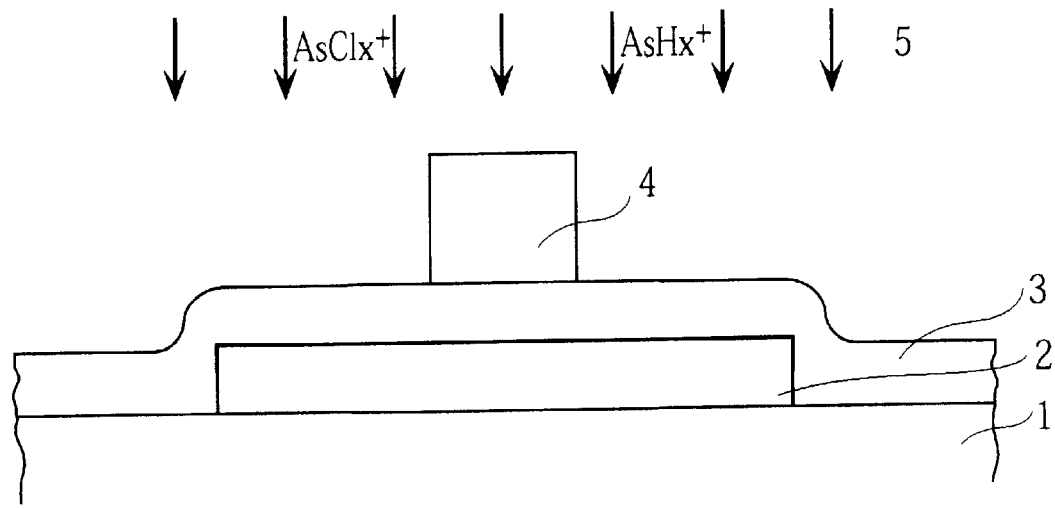
FIGS. 9(a)–9(c) are cross-sectional views illustrating the process of manufacturing a thin-film transistor according to a sixth embodiment of the present invention.

At this stage, impurity ions 5 are implanted by using the gate electrode 4 as a mask, as shown in FIG. 9(a).

Subsequently, ion doping is performed by using a mixture of a plurality of source gases containing the same element of As but having different molecular weights.

Specifically 0.5 to 1% AsH, diluted with hydrogen and AsCl, are used as the first source gas containing an As hydride and the second source gas containing an As halide and supplied at flow rates of 0.5 to 10 sccm and 10 to 100 sccm, respectively. Doping is performed with an acceleration voltage of 70 to 150 kV.

In this case, the amount of the first source gas implanted to form the LDD regions is set smaller than the amount of the second source gas implanted to form the source/drain regions, similarly to each of the foregoing embodiments.

Figure 9B:
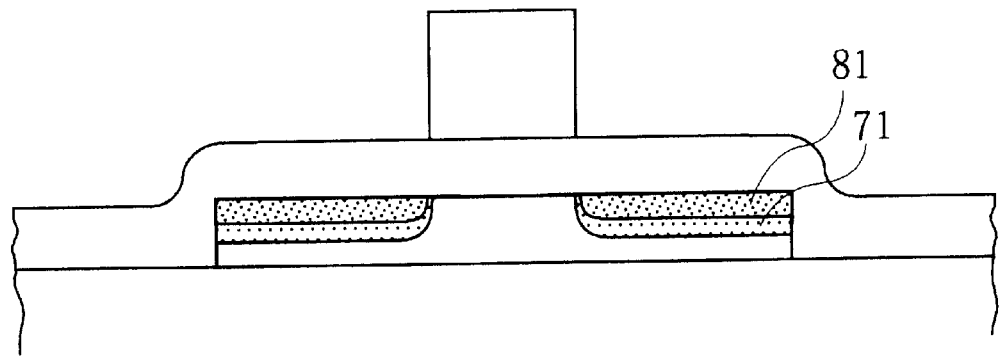
Figure 9C:
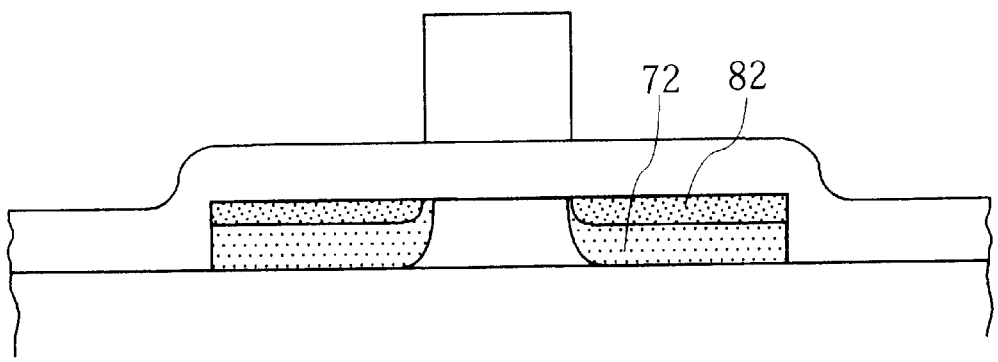

The ion doping process provides an impurity profile as shown in FIG. 9(b).

More specifically, the As hydride contained in the first source gas has a molecular weight smaller than that of the As halide contained in the second source gas, so that higher kinetic energy is imparted to As.

If ion doping is performed with the acceleration voltage of 70 to 150 kV, therefore, As contained in the As hydride is introduced deeper into a semiconductor layer 2 than As contained in the As chloride.

As a result, first impurity regions 71 containing As at a low concentration and second impurity regions 81 containing As at a high concentration are formed as shown in FIG. 9(b).

The impurities are slightly diffused by thermal treatment performed subsequently to active the impurities. Consequently, As is diffused extensively from the regions immediately under the side faces of the gate electrode 4 to regions closer to the center of the gate electrode, resulting in the LDD regions 72 and the source/drain regions 82.

Thus, the present embodiment uses the source gases containing As and having different molecular weights to introduce As as an impurity into the semiconductor layer 2 and thereby form the n-type impurity regions.

This allows the formation of the LDD regions composed of low-concentration n$^-$layers and the source/drain regions composed of high-concentration n$^+$layers by a single step of impurity introduction.

Although the present embodiment has been achieved in accordance with the first embodiment, it will be appreciated that the present embodiment may also be achieved in accordance with the second to fourth embodiments.

Although the present embodiment has used the As hydride and the As chloride as the source gases containing As and having different molecular weights, it will be appreciated that the hydride and chloride need not necessarily be used and that P may be used instead of As.

Although the present embodiment has described the formation of the n-type layers, such a combination of $B_2H_6$ and $BF_3$ may be used if B is used as an impurity element to form p-type layers.

Embodiment 7

A description will be given next to still another embodiment of the method of manufacturing a thin-film transistor according to the present invention.

Figure 10A:
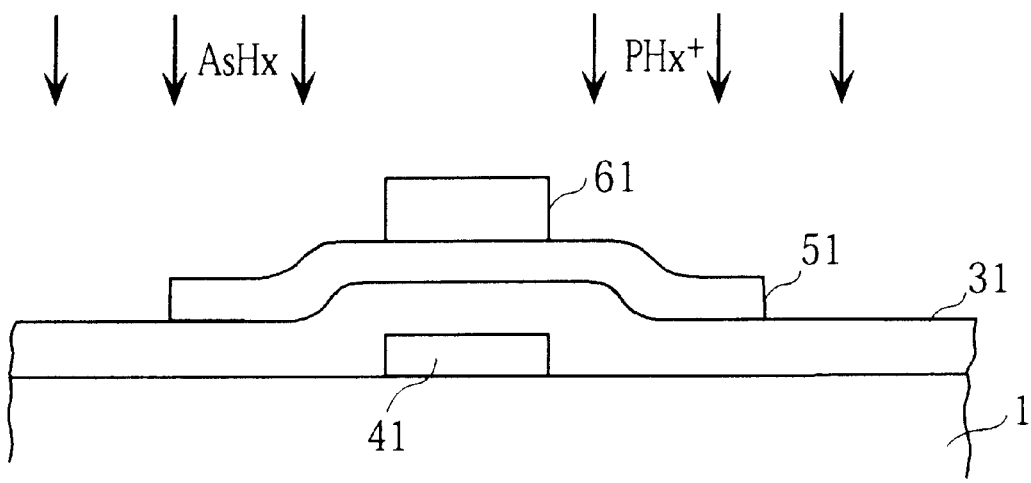
FIGS. 10(a)–10(b) are cross-sectional views illustrating the process of manufacturing a bottom-gate thin-film transistor according to a seventh embodiment of the present invention.
Figure 10B:
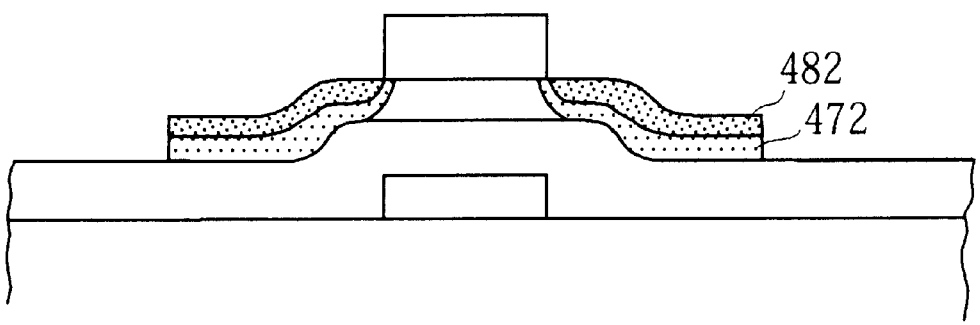

The present embodiment is different from any of the foregoing embodiments in that a bottom-gate transistor as shown in FIGS. 10 is manufactured.

In FIGS. 10(a) are shown: a glass substrate 1; a gate electrode 41 formed of Cr, Al, or the like on the glass substrate and having a thickness on the order of 50 to 200 nm; a gate insulating layer 31 composed of $SiO_2$ and having a thickness on the order of 50 to 400 nm; a semiconductor film 21 composed of Si crystallized by laser annealing, thermal treatment at 500 to 600° C., or the like and having a thickness on the order of 20 to 100 nm; and a protective film 61 composed of $SiO_2$ and having a thickness on the order of 100 to 400 nm.

Into the semiconductor device, As an P are implanted with an acceleration voltage of 10 to 100 kV under otherwise the same conditions as in the first embodiment by using the protective film as a mask.

As a result, source/drain regions 482 composed of n$^+$layers containing the impurities of As and P at high concentrations and LDD regions 472 composed of n$^-$layers containing only the impurity of P at a low concentration.

Although the present embodiment has been achieved in accordance with the first embodiment, it will be appreciated that the present embodiment may also be achieved in accordance with the other embodiments.

Embodiment 8

A description will be given next to yet another embodiment of the method of manufacturing a thin-film transistor according to the present invention.

Figure 11:
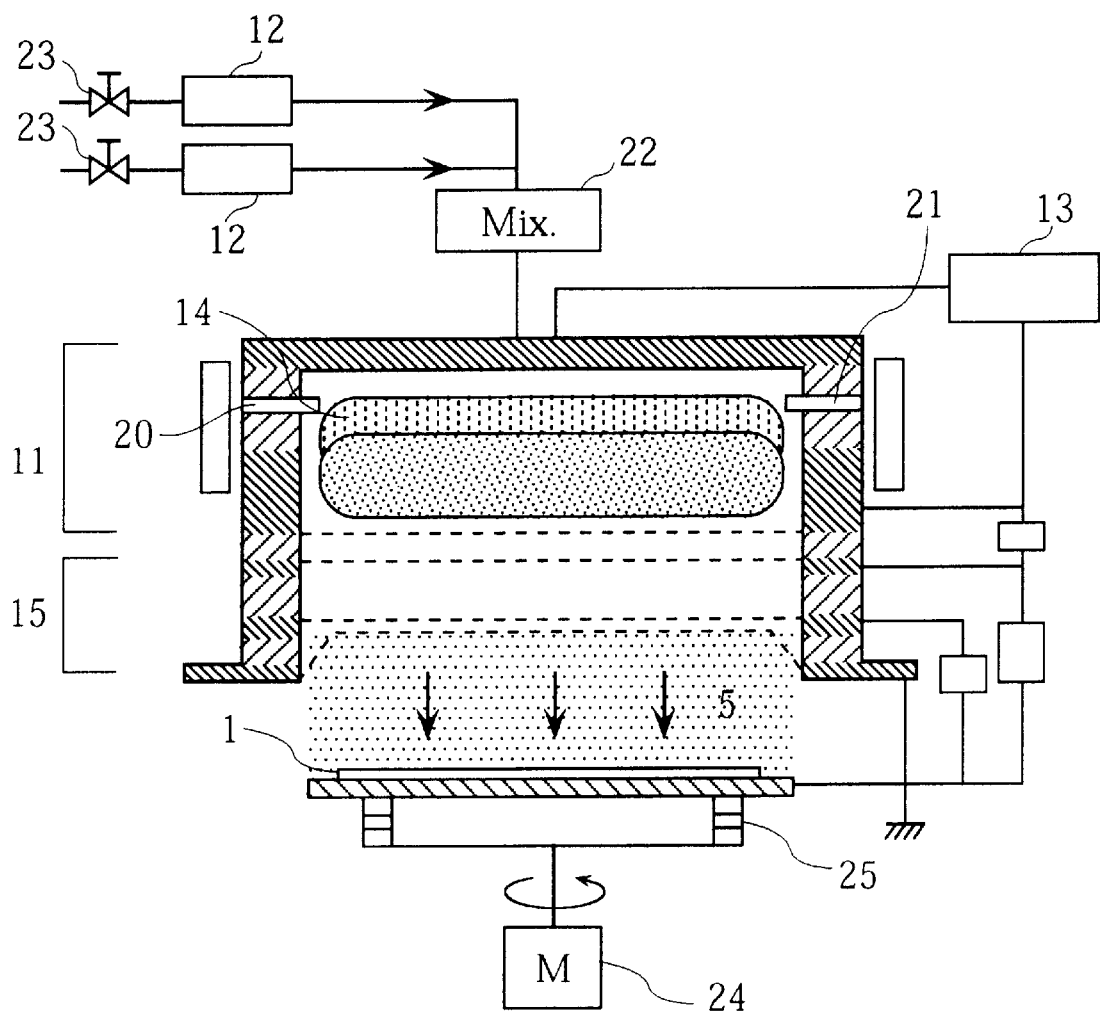
FIG. 11 is a schematic view showing the structure of an ion doping apparatus according to an eighth embodiment of the present invention.

As shown in FIGS. 11, the eighth embodiment is greatly different from any of the foregoing embodiments in that a microwave (VHF) discharger 29 and an electron gun 21 are provided as means for changing source gases into a plasma in addition to the RF power source 13.

The present embodiment is also different from any of the foregoing embodiments in that a chamber 11 is vertically elongated and that a mixer 22 for positively mixing the source gases, valves 23 for the respective source gases, a motor for rotating the substrate, and a tilting jig 24 are provided.

Since the chamber 11 is vertically elongated, the plasma space is also extended vertically so that a part of ions charged to be monovalent by the RF power source in an upper position can also be charged to be divalent by the electron gun or the like in a lower position. Thus, the difference in projected range due to the difference in electrovalency can also be utilized.

Moreover, the microwave discharger 20 and the electron gun 21 achieve simultaneous production of monovalent and divalent charged particles, such as $PH_3^+$and $PH_3^{++}$by using, e.g., $PH_3$. It becomes therefore possible to impart different projected ranges to one and the same impurity element (aside from diluting hydrogen gas) by using a single source gas.

It is also possible to use, as source gases, a plurality of hydrides of the same impurity such as $AsH_3$ and $As_2H_4$, $B_2H_6$, $B_2H_{10}$, and $B_5H_9$, or $PH_3$ and $P_2H_4$. In this case, if $PH_3$ and $P_2H_4$ are used, for example, P contained in $PH_3$ has substantially double the energy of P contained in $P_2H_4$ provided that the electrovalency of each ion derived from $PH_3$ and $P_2H_4$ is 1.

Hence, it is no more necessary to use the gas of a compound with an element having large mass such as chlorine or fluorine in order to impart different projected ranges to one and the same impurity element so that the adverse affect on the semiconductor device during doping is lessened compared with the sixth embodiment.

Accordingly, the doping apparatus can be used more flexibly to perform extended functions.

It is also possible to implant only the same type of impurity ions each having the same projected range before or after plural types of impurity ions having different projected ranges are implanted by opening and closing the valves.

From this viewpoint, the doping apparatus can be used more flexibly to perform extended functions.

Although the present invention has been described with reference to several embodiments, it will be appreciated that the present invention is not limited thereto. For example, the following modifications can be made.

(1) Application of the present invention to an LSI, not to the thin-film transistor (2) Use of helium, not hydrogen, as diluting gas (3) Use of another substance such as amorphous silicon, not polysilicon, in the semiconductor layer (4) Variable acceleration distance and variable acceleration voltage (5) Supply of an ion beam to separate, small substrates arranged in rows and columns (6) Scaling down of an apparatus for doping smaller substrates with the provision of a plasma chamber reduced in diameter (7) Rotation of an ion source relative to the substrate during oblique ion implantation (8) Concurrent use of the process of implanting the same type of ions each having the same projected range (9) Determination of the type of an impurity to be implanted and the acceleration voltage for ions based on the thickness of a gate electrode or protective film as a mask which has been predetermined for the convenience of manufacturing such that substantially the same structure, though apparently different, is implemented.

What is claimed is:

1. A method of manufacturing a transistor by ionizing at least one impurity element into plural types of impurity ions having different projected ranges and different scatterings before stopping, and different distributions in a direction vertical to a depth direction below a mask after projecting, accelerating the impurity ions with a voltage, and implanting the accelerated impurity ions into a semiconductor region comprising a semiconductor layer formed on a substrate, a gate insulating layer formed over said semiconductor layer, and a gate electrode formed on said gate insulating layer, said method comprising:

forming a gate-electrode on the gate insulating layer, the gate electrode having a thickness determined by the projected ranges of the implanted impurity ions, said gate electrode also serving as a mask during ionizing at least one impurity element into plural types of impurity ions, accelerating the impurity ions with a voltage and implanting the accelerated ions;

mixing a plurality of compounds of the impurity element to produce a source gas;

supplying the source gas to an ionization chamber;

ionizing the source gas; and supplying specific kinetic energy to the impurity ions derived from the source gas and thereby doping the impurity ions into the semiconductor region on the substrate to form a source or drain region and an LDD region near the source or drain region below the mask.

2. The method of manufacturing a transistor according to claim 1, wherein said gate-electrode forming step has an additional-mask forming substep of forming, on a side face of the gate electrode, an insulating film serving as a mask in combination with the gate electrode during doping.

3. The method of manufacturing a transistor according to claim 2, further comprising:

prior to said doping step, forming a tilt angle predetermined by the height and width of the mask and by a spacing between adjacent masks between a normal to the substrate and the direction in which the impurity ions to be implanted are supplied in said doping step; and simultaneously with said doping step, rotating the substrate relative to an ion source to prevent the gate electrode from casting a shadow on the supplied impurity ions.

4. The method of manufacturing a transistor according to claim 3, further comprising:

prior to said mixing step, a doping-element selecting step of selecting, as an impurity element, at least one of respective compounds of a group III element and a group VI element.

5. The method of manufacturing a transistor according to claim 4, wherein said doping-element selecting step is a P/As selecting step of selecting P and As as impurity elements.

6. The method of manufacturing a transistor according to claim 5, wherein said P/As selecting step has a hydride selecting substep of selecting a hydride of P and a hydride of As as a compound of P and a compound of As mixed with each other in said mixing step.

7. The method of manufacturing a transistor according to claim 3, further comprising prior to said mixing step, a different-conductivity-type-impurity-element selecting step of selecting impurity elements having different conductivity types.

8. The method of manufacturing a transistor according to claim 7, wherein said different-conductivity-type-impurity-element selecting step is a P/As/B selecting step of selecting P, As, and B as impurity elements.

9. The method of manufacturing a transistor according to claim 8, wherein said P/As/B selecting step has a hydride selecting substep of selecting a hydride of P, a hydride of As, and a hydride of B as a compound of P, a compound of As, and a compound of B mixed with each other in said mixing step.

10. The method of manufacturing a transistor according to claim 3, further comprising prior to said mixing step, a single-doping-element selecting step of selecting, as an impurity element, a plurality of compounds of a single impurity element and expressed in different molecular formulae.

11. The method of manufacturing a transistor according to claim 10, wherein said single-doping-element selecting step has a hydride selecting substep of selecting a hydride of an impurity element as at least one compound.

12. The method of manufacturing a transistor according to claim 2, further comprising:

prior to said mixing step, a doping-element selecting step of selecting, as an impurity element, at least one of respective compounds of a group III element and a group VI element.

13. The method of manufacturing a transistor according to claim 12, wherein said doping-element selecting step is a P/As selecting step of selecting P and As as impurity elements.

14. The method of manufacturing a transistor according to claim 13, wherein said P/As selecting step has a hydride selecting substep of selecting a hydride of P and a hydride of As as a compound of P and a compound of As mixed with each other in said mixing step.

15. The method of manufacturing a transistor according to claim 2, further comprising prior to said mixing step, a different-conductivity-type-impurity-element selecting step of selecting impurity elements having different conductivity types.

16. The method of manufacturing a transistor according to claim 15, wherein said different-conductivity-type-impurity-element selecting step is a P/As/B selecting step of selecting P, As, and B as impurity elements.

17. The method of manufacturing a transistor according to claim 16, wherein said P/As/B selecting step has a hydride selecting substep of selecting a hydride of P, a hydride of As, and a hydride of B as a compound of P, a compound of As, and a compound of B mixed with each other in said mixing step.

18. The method of manufacturing a transistor according to claim 2, further comprising prior to said mixing step, a single-doping-element selecting step of selecting, as an impurity element, a plurality of compounds of a single impurity element and expressed in different molecular formulae.

19. The method of manufacturing a transistor according to claim 18, wherein said single-doping-element selecting step has a hydride selecting substep of selecting a hydride of an impurity element as at least one compound.

20. The method of manufacturing a transistor according to claim 1, further comprising:

prior to said doping step, a tilting step of forming a tilt angle predetermined by the height and width of the mask and by a spacing between the mask of adjacent transistors between a normal to the substrate and the direction in which the impurity ions to be implanted are supplied in said doping step; and simultaneously with said doping step, a rotating step of rotating the substrate relative to an ion source to prevent the gate electrode from casting a shadow on the supplied impurity ions.

21. The method of manufacturing a transistor according to claim 20, further comprising:

prior to said mixing step, a doping-element selecting step of selecting, as an impurity element, at least one of respective compounds of a group III element and a group VI element.

22. The method of manufacturing a transistor according to claim 21, wherein said doping-element selecting step is a P/As selecting step of selecting P and As as impurity elements.

23. The method of manufacturing a transistor according to claim 22, wherein said P/As selecting step has a hydride selecting substep of selecting a hydride of P and a hydride of As as a compound of P and a compound of As mixed with each other in said mixing step.

24. The method of manufacturing a transistor according to claim 20, further comprising prior to said mixing step, a different-conductivity-type-impurity-element selecting step of selecting impurity elements having different conductivity types.

25. The method of manufacturing a transistor according to claim 24, wherein said different-conductivity-type-impurity-element selecting step is a P/As/B selecting step of selecting P, As, and B as impurity elements.

26. The method of manufacturing a transistor according to claim 25, wherein said P/As/B selecting step has a hydride selecting substep of selecting a hydride of P, a hydride of As, and a hydride of B as a compound of P, a compound of As, and a compound of B mixed with each other in said mixing step.

27. The method of manufacturing a transistor according to claim 20, further comprising prior to said mixing step, a single-doping-element selecting step of selecting, as an impurity element, a plurality of compounds of a single impurity element and expressed in different molecular formulae.

28. The method of manufacturing a transistor according to claim 27, wherein said single-doping-element selecting step has a hydride selecting substep of selecting a hydride of an impurity element as at least one compound.

29. The method of manufacturing a transistor according to claim 1, further comprising:

prior to said mixing step, a doping-element selecting step of selecting, as an impurity element, at least one of respective compounds of a group III element and a group VI element.

30. The method of manufacturing a transistor according to claim 29, wherein said doping-element selecting step is a P/As selecting step of selecting P and As as impurity elements.

31. The method of manufacturing a transistor according to claim 30, wherein said P/As selecting step has a hydride selecting substep of selecting a hydride of P and a hydride of As as a compound of P and a compound of As mixed with each other in said mixing step.

32. The method of manufacturing a transistor according to claim 1, further comprising prior to said mixing step, a different-conductivity-type-impurity-element selecting step of selecting impurity elements having different conductivity types.

33. The method of manufacturing a transistor according to claim 32, wherein said different-conductivity-type-impurity-element selecting step is a P/As/B selecting step of selecting P, As, and B as impurity elements.

34. The method of manufacturing a transistor according to claim 33, wherein said P/As/B selecting step has a hydride selecting substep of selecting a hydride of P, a hydride of As, and a hydride of B as a compound of P, a compound of As, and a compound of B mixed with each other in said mixing step.

35. The method of manufacturing a transistor according to claim 1, further comprising prior to said mixing step, a single-doping-element selecting step of selecting, as an impurity element, a plurality of compounds of a single impurity element and expressed in different molecular formulae.

36. The method of manufacturing a transistor according to claim 35, wherein said single-doping-element selecting step has a hydride selecting substep of selecting a hydride of an impurity element as at least one compound.

37. A method of manufacturing a transistor by ionizing at least one impurity element into plural types of impurity ions having different projected ranges and different scatterings before stopping and different distributions in a direction vertical to a depth direction below a mask after projecting, accelerating the impurity ions with a voltage, and implanting the accelerated impurity ions into a semiconductor region comprising a semiconductor layer formed on a substrate, a gate insulating layer formed over said semiconductor layer, and a gate electrode formed on said gate insulating layer, said method comprising:

forming a gate electrode having a thickness determined by the projected ranges of the implanted impurity ions such that the gate electrode serves as at least a part of a mask during doping;

supplying a gas containing at least one compound of the impurity element as a source gas to an ionization chamber;

ionizing the supplied source gas such that the plural types of ions of the impurity element having the predetermined projected ranges are derived therefrom; and supplying specified kinetic energy to the impurity ions derived from the source gas and thereby doping the impurity ions into the semiconductor region on the substrate to form a source or drain region and an LDD region near the source or drain region below the mask.

38. A method of manufacturing a transistor by ionizing at least one impurity element into plural types of impurity ions having different projected ranges and different scatterings before stopping, and different distributions in a direction vertical to a depth direction below a mask after projecting, accelerating the impurity ions with a voltage, and implanting the accelerated impurity ions into a semiconductor region comprising a gate electrode formed on a substrate, a gate insulating layer formed over the gate electrode and the substrate, and a semiconductor layer formed on said gate insulating layer, said method comprising:

forming a mask having a thickness determined by the projected ranges of the implanted impurity ions on the semiconductor layer over the gate electrode;

mixing a plurality of compounds of the impurity element to produce a source gas;

supplying the source gas to an ionization chamber;

ionizing the source gas; and supplying specific kinetic energy to the impurity ions derived from the source gas and thereby doping the impurity ions into the semiconductor region on the substrate to form a source or drain region and an LDD region near the source or drain region below the mask.

39. A method of manufacturing a transistor by ionizing at least one impurity element into plural types of impurity ions having different projected ranges and different scatterings before stopping, and different distributions in a direction vertical to a depth direction below a mask after projecting, accelerating the impurity ions with a voltage, and implanting the accelerated impurity ions into a semiconductor region comprising a gate electrode formed on a substrate, a gate insulating layer formed over the gate electrode and the substrate, and a semiconductor layer formed on said gate insulating layer, said method comprising:

forming a mask having a thickness determined by the projected ranges of the implanted impurity ions on the semiconductor layer over the gate electrode;

supplying a gas containing at least one compound of the impurity element as a source gas to a plasma chamber;

ionizing the supplied source gas such that the plural types ions of the impurity element having the predetermined projected ranges are derived therefrom;

supplying specified kinetic energy to the impurity ions and thereby doping the impurity ions into the semiconductor region on the substrate to form a source or drain region and an LDD region near the source or drain region below the mask.

* * * * *